July 25, 1961 R. BRAY 2,993,989

SIGNAL-SEEKING RECEIVER

Filed Oct. 31, 1958 2 Sheets-Sheet 1

INVENTOR.
RALPH BRAY
BY Fordyce A. Bothwell
ATTORNEY

July 25, 1961 R. BRAY 2,993,989

SIGNAL-SEEKING RECEIVER

Filed Oct. 31, 1958 2 Sheets-Sheet 2

INVENTOR.
RALPH BRAY
BY
Fordyce A. Bothwell
ATTORNEY

United States Patent Office 2,993,989

Patented July 25, 1961

2,993,989
SIGNAL-SEEKING RECEIVER

Ralph Bray, Philadelphia, Pa., assignor to Philco Corporation, Philadelphia, Pa., a corporation of Pennsylvania Filed Oct. 31, 1958, Ser. No. 771,024
6 Claims. (Cl. 250—20)

This invention relates to signal receivers of the signal-seeking type which function, in response to a starting operation, to effect automatic tuning to the next higher or lower frequency signal in the reception range or band. Radio receivers of this type are particularly useful in vehicles, such as automobiles, as they require a minimum amount of attention on the part of the operator.

In any signal-seeking receiver it is necessary to make provision for stoppage of the automatic tuning operation when the receiver is properly tuned to a received signal. The stoppage of the automatic tuning operation is effected by a triggering action which is initiated in response to the proper tuning in of a signal. Usually a relay is energized to initiate the automatic tuning operation and is de-energized by the triggering action to stop the tuning. As is well understood, the conventional superheterodyne receiver, which has long been in common use, comprises the R.F. and I.F. stages, the detector-A.G.C. stage, the detected signal amplifier stage or stages, and the reproducing means. In the past, signal-seeking receivers generally have further required not only a motor and a relay but also additional tubes and circuit components which add substantially to the cost of the receiver.

One object of the present invention is to provide a signal-seeking receiver wherein the number of added parts required for the signal-seeking operation is reduced to a minimum.

Another object of the invention is to provide a signal-seeking receiver wherein accuracy of tuning is assured.

Other objects and features of the invention will appear from the description to follow.

In accordance with this invention, a novel arrangement is provided whereby the signal detector-A.G.C. stage is convertible in simple manner to serve as the sensing and triggering means during the signal-seeking operation. As will be seen later, this is accomplished by the simple provision of an additional resistor and an additional pair of contacts on the relay. Thus the number of additional components required for the signal sensing and triggering function is reduced to a minimum.

Furthermore, in the preferred embodiment of the present invention, the detected signal amplifier stages of the receiver are utilized, during the signal-seeking operation, to amplify the triggering voltage which is produced by the converted detector-A.G.C. stage. This makes it unnecessary to provide any additional amplifier stages for the signal-seeking operation, and it thus avoids the added expense of such stages.

Figure 1:
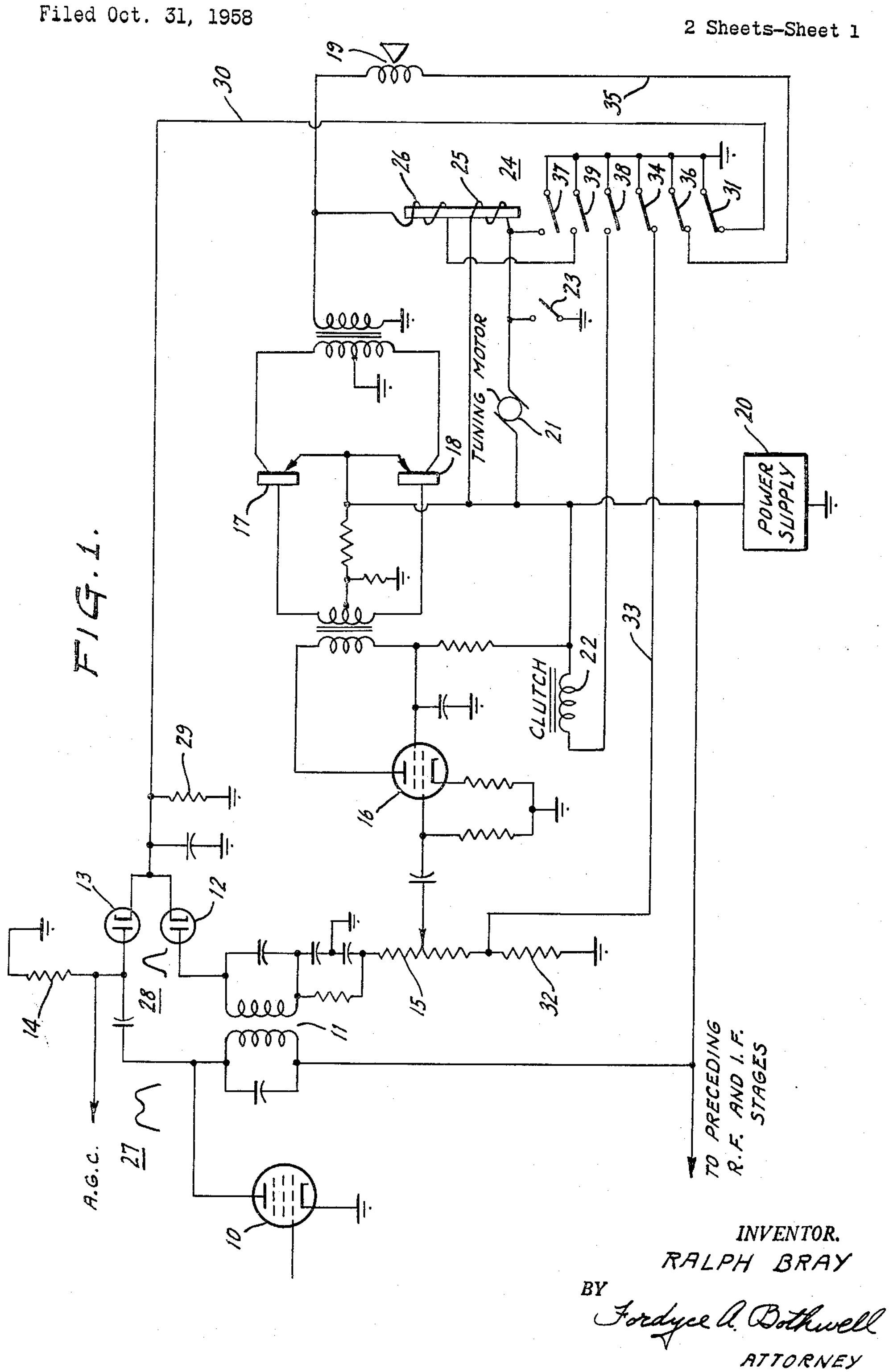
Figure 2:
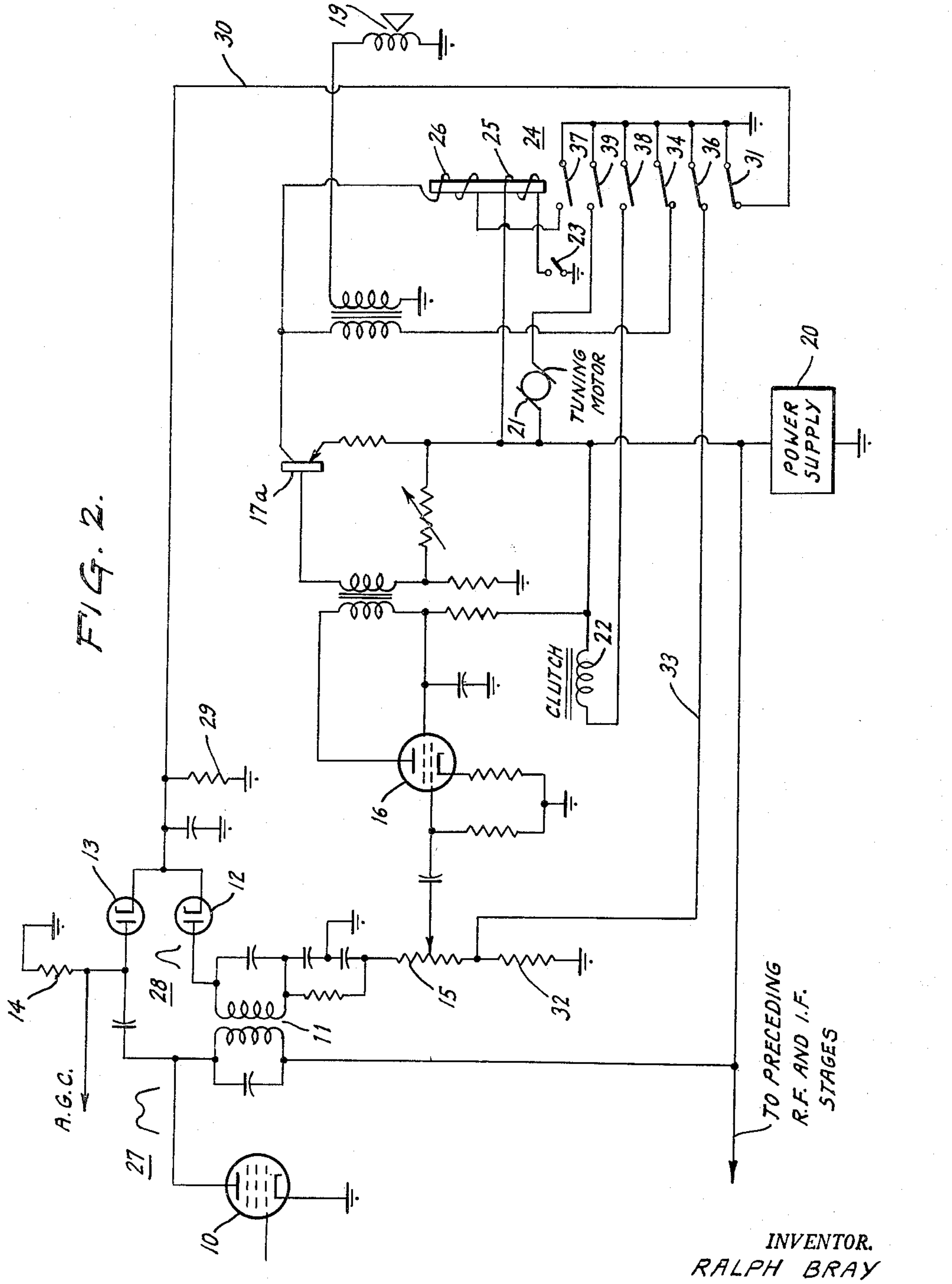

The invention may be fully understood from the following detailed description with reference to the accompanying drawings wherein FIG. 1 is a diagrammatic illustration of one embodiment of the invention as applied to a signal-seeking superheterodyne radio receiver; and FIG. 2 is a similar illustration of another embodiment.

The present invention is not concerned with the conventional R.F. and I.F. stages of the receiver except for the fact that the triggering pulse for effecting stoppage of the signal-seeking tuning operation is produced in response to the primary and secondary voltages of the last I.F. transformer. For simplicity, therefore, the illustration in FIG. 1 commences with the last I.F. stage, including the I.F. amplifier tube 10 and the I.F. output transformer 11 having tuned primary and secondary windings. The detector-A.G.C. stage includes the detector diode 12 and the A.G.C. diode 13 and resistor 14 across which a negative swinging A.G.C. voltage is developed. During normal receiver operation, the detected audio signal appears across the volume control potentiometer 15 and is supplied to the audio amplifier stages which are shown to comprise a vacuum tube amplifier 16 and a push-pull output stage employing transistors 17 and 18. The amplified audio signal is supplied to a loud speaker 19.

The necessary operating voltage for the various stages of the receiver are furnished by the D.C. power supply 20, which also furnishes the necessary power for the signal-seeking operation. As is common in signal-seeking receivers, the receiver illustrated employs an electric motor 21 which, upon initiation of signal-seeking operation, is mechanically coupled to the receiver tuning mechanism through an electrically-operated clutch whose operating coil is shown at 22.

The signal-seeking operation is initiated by momentary closure of the starting switch 23 which initiates energization of relay 24. The latter has a relatively high resistance (e.g. 100 ohms) operating and holding coil 25 and a relatively low resistance (e.g. 5 ohms) release coil 26. The initial energization of coil 25 by momentary closure of switch 23 causes movement of the contacts away from their normal position as shown, and the relay locks itself in through contact 37. Although a circuit is completed through coil 26 by closure of contact 39, no current flows therein until a triggering voltage is applied to the input of tube 16. Then current flows through coil 26 and produces a magnetic field in opposition to that produced by coil 25, causing the relay to drop out.

Referring now to the signal-seeking tuning operation and the manner in which it is performed, as in prior signal-seeking receivers the primary and secondary windings of the I.F. output transformer 11 are critically coupled so that the response characteristic of the primary is relatively broad and double-humped as represented at 27, while the response characteristic of the secondary is relatively narrow and single-peaked as represented at 28.

Now in accordance with one feature of the present invention there is provided a resistor 29 which is normally short-circuited by way of conductor 30 and normally-closed relay contact 31. When contact 31 is open, during signal-seeking tuning in of a signal, the signal voltage of the primary is rectified by diode 13 and produces across resistor 29 a positive voltage which biases diode 12 against conduction. At the same time the signal voltage of the secondary tends to render the diode 12 conductive. It will be seen therefore that the diode 12 will not conduct until the receiver is properly tuned to a received signal, at which time the primary voltage corresponds to the central depressed portion of the response characteristic 27 and the secondary voltage corresponds to the central peak portion of the response characteristic 28 and overrides the bias across resistor 29. Consequently a voltage appears across the volume control potentiometer 15, which voltage is equal to the difference between the secondary and primary signal voltages. This difference voltage is amplified in the audio amplifier stages and causes energization of winding 26 to cause drop-out of the relay 24 and consequent stoppage of the signal-seeking tuning operation.

In order that the triggering voltage shall not be appreciably affected by the setting of the volume control potentiometer 15, there is included in series therewith a relatively large resistor 32 which is normally short-circuited by way of conductor 33 and relay contact 34 but is in circuit during signal-seeking tuning. This assures that even with a low setting of the volume control a suitable triggering voltage will be supplied to the audio amplifier stages to energize coil 26.

The overall operation of the receiver will now be described. Normally the relay 24 is not energized and the resistors 29 and 32 are short-circuited through the normally-closed contacts 31 and 34. The audio output circuit through the loud speaker 19 is completed through conductor 35 and normally-closed contact 36. All of the other relay contacts are open. It may be assumed that the radio receiver has been tuned, either manually or by signal-seeking tuning, and it functions in the usual manner of any present day receiver.

Assume now that it is desired to initiate signal-seeking tuning. The operator momentarily closes the starting switch 23, energizing winding 25. The relay picks up and locks itself in through contact 37. Contacts 31, 34 and 36 open to introduce resistors 29 and 32 and to open the loud speaker circuit to mute the receiver. Contacts 38 and 39 close to energize the clutch-operating coil 22 and to close a circuit through winding 26. Motor 21 is energized through contact 37, and the signal-seeking tuning operation commences and proceeds until the next higher or lower frequency signal (depending on the direction of tuning) is properly tuned in. At that time the signal-seeking tuning operation is terminated as hereinbefore described, and the receiver subsequently functions in the normal manner.

Regarding the direction of signal-seeking tuning, the system may be of the bidirectional type, in which case the motor is automatically reversed at each end of the band, or the system may be of the unidirectional type, in which case the tuning mechanism is abruptly returned to starting position. Both types of systems are known, and since the present invention is not concerned with the type of system but is applicable to both types, there is no need for further illustration or description.

From the foregoing description it will be seen that the present invention provides a novel arrangement whereby the number of additional components required for signal-seeking tuning is reduced to a minimum and accuracy of tuning is assured because the diode 12 is biased against conduction by the rectified primary signal voltage and can only conduct when the secondary signal voltage exceeds the primary voltage.

It should be noted further that the inclusion of resistor 32 only during signal-seeking tuning achieves further advantages. The inclusion of this resistor facilitates achievement, during signal-seeking tuning, of the desired narrow single-peaked secondary characteristic 28 whose peak is accurately aligned with the central depression of the primary characteristic 27. However, if this resistor were permitted to remain in the circuit during normal receiver operation, it would cause distortion of the audio signal. This is avoided by inserting the resistor only during signal-seeking operation when it serves a useful purpose and has no adverse effect. The foregoing may be explained as follows.

A relatively high D.C. diode load (volume control) is usually required to maintain Q and narrow waveform development in the I.F. transformer secondary. This, in turn, leads to diode A.C.-D.C. impedance ratio difficulties with possible high modulation distortion. Also for a given volume (sound) level, the slider arm will be at a higher D.C. resistance level with a 1 megohm control, for instance, than with a 300K ohm control. Audio voltage appearing at the first audio amplifier grid due to stray or tube capacity coupling will find a higher impedance in the first instance and will result in greater distortion of the desired signal.

In the past there have been production padding difficulties in obtaining symmetry or accurate peaking of the secondary with respect to the center of the relatively broad band primary. This is necessary to obtain precise tuning stopping accuracy in both directions of tuner travel. To obtain required pulse width and pulse amplitude it is generally necessary to slightly exceed critical coupling. Small transformer variations and/or variations in coil loading can result in some secondary double peaking, making symmetrical alignment rather difficult. The circuit shown in FIG. 1 overcomes the difficulty due to increased secondary loading during normal radio operation. This effectively reduces the coupling slightly below critical and minimizes double hump formation. Tests have shown that careful normal peak tuning of the I.F. circuits will result in correct pulse development during the signal-seeking operation.

In one physical embodiment of the invention, the resistors 29 and 32 each have a value of 3.3 megohms. The volume control potentiometer has a resistance of 350,000 ohms.

FIG. 2 shows another embodiment which is identical with that of FIG. 1 except for the following differences. In FIG. 2 the audio output stage employs a single transistor **17*a* in which collector current flows continuously whenever relay 24 is energized. Winding 25 in this instance serves only for starting. Winding 26 is connected in the collector circuit of transistor 17*a* and serves both for holding and release, holding the relay in through contact 37. The direction of current through winding 26 is such that it holds the relay in until the collector current is reduced by the triggering voltage. In this instance the audio output circuit is completed through contact 34; the shorting connections for resistors 29 and 32 extend through contacts 31 and 36; and the motor circuit is completed through contact 39**. Otherwise the system of FIG. 2 is the same as that of FIG. 1 and operates in the same manner except for the specific operation of the output stage.

While certain embodiments of the invention have been illustrated and described, the invention is not limited thereto but contemplates such further embodiments as may occur to those skilled in the art.

I claim:

1. In a signal-seeking radio receiver, an intermediate frequency transformer comprising tuned primary and secondary windings in which signal voltages appear, the tuned primary winding having a relatively broad double-humped responsive characteristic, and the tuned secondary winding having a relatively narrow single-peaked response characteristic, an audio detector diode connected in circuit with said secondary winding, means operative during signal-seeking tuning operation for preventing conduction by said diode until the secondary signal voltage corresponds to the peak of said single-peaked characteristic and exceeds the primary signal voltage, a volume control potentiometer in circuit with said diode and across which a triggering voltage is produced when said diode conducts during signal-seeking tuning, audio amplifying means to which audio signal is normally supplied from said potentiometer and which serves to amplify said triggering voltage, a resistor, means for including said resistor in series with said potentiometer only during signal seeking tuning to insure adequate triggering voltage regardless of the volume control setting, and means responsive to the amplified triggering voltage for terminating the signal-seeking tuning operation.

2. In a signal-seeking radio receiver, an intermediate-frequency transformer comprising tuned primary and secondary windings in which signal voltages appear, the tuned primary winding having a relatively broad double-humped response characteristic, and the tuned secondary winding having a relatively narrow single-peaked response characteristic, automatic gain control means including a diode coupled to said primary winding, an audio detector diode connected in circuit with said secondary winding, a resistor connected to both of said diodes, means for short-circuiting said resistor during signal reception and for including said resistor in circuit during signal-seeking tuning operation whereby a bias is established across said resistor according to the amplitude of the primary signal voltage to prevent conduction of said detector diode until the secondary signal voltage exceeds the primary signal voltage, means in circuit with said detector diode for developing a triggering voltage when the detector diode conducts during signal-seeking tuning, audio amplifying means, means for supplying said triggering voltage to said amplifying means, and means responsive to the amplified triggering voltage for terminating the signal-seeking tuning operation.

3. In a signal-seeking radio receiver, an intermediate-frequency transformer comprising tuned primary and secondary windings in which signal voltages appear, the tuned primary winding having a relatively broad double-humped response characteristic, and the tuned secondary winding having a relatively narrow single-peaked response characteristic, automatic gain control means including a diode coupled to said primary winding, an audio detector diode connected in circuit with said secondary winding, a resistor connected to both of said diodes, means for short-circuiting said resistor during signal reception and for including said resistor in circuit during signal-seeking tuning operation whereby a bias is established across said resistor according to the amplitude of the primary signal voltage to prevent conduction of said detector diode until the secondary signal voltage exceeds the primary signal voltage, a volume control potentiometer in circuit with said detector diode and across which a triggering voltage is produced when the detector diode conducts during signal-seeking tuning, audio amplifying means to which audio signal is normally supplied from said potentiometer and which serves to amplify said triggering voltage, a second resistor, means for including said second resistor in series with said potentiometer during signal-seeking tuning to insure adequate triggering voltage regardless of the volume control setting, and means responsive to the amplified triggering voltage for terminating the signal-seeking tuning operation.

4. In a signal-seeking radio receiver, an intermediate-frequency transformer comprising tuned primary and secondary windings in which signal voltages appear, the tuned primary winding having a relatively broad double-humped response characteristics, and the tuned secondary winding having a relatively narrow single-peaked response characteristic, automatic gain control means including a diode coupled to said primary winding, an audio detector diode connected in circuit with said secondary winding, a resistor connected to both of said diodes, means for short-circuiting said resistor during signal reception and for including said resistor in circuit during signal-seeking tuning operation whereby a bias is established across said resistor according to the amplitude of the primary signal voltage to prevent conduction of said detector diode until the secondary signal voltage exceeds the primary signal voltage, and means responsive to conduction of said detector diode for terminating the signal-seeking tuning operation.

5. In a signal-seeking radio receiver, an intermediate-frequency output transformer comprising tuned primary and secondary windings in which signal voltages appear, the tuned primary winding having a relatively broad double-humped response characteristic, and the tuned secondary winding having a relatively narrow single-peaked response characteristic, an audio detector diode connected in circuit with said secondary winding, a resistor, means for including said resistor in circuit with said diode during signal-seeking tuning operation, means for establishing across said resistor a bias corresponding to the amplitude of the primary signal voltage so as to prevent conduction by said diode until the secondary signal voltage corresponds to the peak of said single-peaked characteristic and exceeds the primary signal voltage, a volume control potentiometer in circuit with said detector diode and across which a triggering voltage is produced when said detector diode conducts during signal-seeking tuning, audio amplifying means to which audio signal is normally supplied from said potentiometer and which serves to amplify said triggering voltage, a second resistor, means for including said second resistor in series with said potentiometer only during signal-seeking tuning to insure adequate triggering voltage regardless of the volume control setting, and means responsive to the amplified triggering voltage for terminating the signal-seeking tuning operation.

6. In a signal-seeking radio receiver, an intermediate-frequency transformer comprising tuned primary and secondary windings in which signal voltages appear, the tuned primary winding having a relatively broad double-humped response characteristic, and the tuned secondary winding having a relatively narrow single-peaked response characteristic, automatic gain control means including a diode coupled to said primary winding, an audio detector diode connected in circuit with said secondary winding, a resistor connected to both of said diodes, means for short-circuiting said resistor during signal reception and for including said resistor in circuit during signal-seeking tuning operation whereby a bias is established across said resistor according to the amplitude of the primary signal voltage to prevent conduction of said detector diode until the secondary signal voltage exceeds the primary signal voltage, a volume control potentiometer in circuit with said detector diode and across which a triggering voltage is produced when the detector diode conducts during signal-seeking tuning, audio amplifying means to which audio signal is normally supplied from said potentiometer and which serves to amplify said triggering voltage, means for insuring adequate triggering voltage regardless of the volume control setting, and means responsive to the amplified triggering voltage for terminating the signal-seeking tuning operation.

References Cited in the file of this patent

UNITED STATES PATENTS

| | | |
|---|---|---|
| 2,108,420 | Van Loon | Feb. 15, 1938 |
| 2,652,486 | Guyton | Sept. 15, 1953 |
| 2,652,494 | Guyton | Sept. 15, 1953 |
| 2,863,044 | Guyton | Dec. 2, 1958 |
| 2,876,356 | Birx | Mar. 3, 1959 |
| 2,902,599 | Andrews | Sept. 1, 1959 |
| 2,915,625 | Worcester | Dec. 1, 1959 |